(12) United States Patent
Yu et al.

(10) Patent No.: US 11,270,949 B2
(45) Date of Patent: Mar. 8, 2022

(54) SUBSTRATE AND METHOD FOR MONITORING POSITIONS OF BOUNDARIES OF FILM LAYER ON THE SUBSTRATE

(71) Applicant: TCL CHINA STAR OPTOELECTRONICS TECHNOLOGY CO., LTD., Guangdong (CN)

(72) Inventors: Yun Yu, Guangdong (CN); Huajun Lu, Guangdong (CN); Yue Yan, Guangdong (CN)

(73) Assignee: TCL China Star Optoelectronics Technology Co., Ltd., Guangdong (CN)

( * ) Notice: Subject to any disclaimer, the term of this patent is extended or adjusted under 35 U.S.C. 154(b) by 116 days.

(21) Appl. No.: 16/627,841

(22) PCT Filed: Dec. 19, 2019

(86) PCT No.: PCT/CN2019/126541
§ 371 (c)(1),
(2) Date: Dec. 31, 2019

(87) PCT Pub. No.: WO2021/097991
PCT Pub. Date: May 27, 2021

(65) Prior Publication Data
US 2021/0151383 A1    May 20, 2021

(30) Foreign Application Priority Data
Nov. 19, 2019 (CN) .......................... 201911131299.3

(51) Int. Cl.
*H01L 23/544* (2006.01)
*G02F 1/1337* (2006.01)

(52) U.S. Cl.
CPC .......... *H01L 23/544* (2013.01); *G02F 1/1337* (2013.01); *H01L 2223/54426* (2013.01)

(58) Field of Classification Search
CPC ......... H01L 23/544; H01L 2223/54426; G02F 1/1337; G02F 1/1309; G02F 1/133723; G02F 1/133354; G03F 7/70683
See application file for complete search history.

(56) References Cited

U.S. PATENT DOCUMENTS 9,298,034 B1* 3/2016 Wang ................ G02F 1/133528
10,162,273 B2* 12/2018 Zhang ................ G03F 7/70633
(Continued)

FOREIGN PATENT DOCUMENTS

| CN | 105093697 A | 11/2015 |
|---|---|---|
| CN | 105708466 A | 6/2016 |

(Continued)

OTHER PUBLICATIONS

Machine Translation of CN105093697 (Year: 2021).*
Machine translation of CN209388070 (Year: 2021).*

*Primary Examiner* — Bilkis Jahan
*Assistant Examiner* — Victor V Barzykin
(74) *Attorney, Agent, or Firm* — Mark M. Friedman

(57) ABSTRACT

The present invention provides a substrate and a method for monitoring positions of boundaries of a film layer disposed on a substrate. A plurality of sets of positioning units are provided in a non-display region of the substrate. Each set of the positioning units includes at least two primary positioning marks and corresponding primary positioning rulers. There are at least two secondary positioning marks and corresponding secondary positioning rulers disposed between the two adjacent primary positioning marks. The present invention determines a specific position of the boundaries of the film layer according to readings of the (Continued)

positioning rulers of the plurality of sets of positioning units corresponding to the boundaries of the film layer.

13 Claims, 5 Drawing Sheets

(56) References Cited

U.S. PATENT DOCUMENTS

2016/0363820 A1* 12/2016 Li ........................ G02F 1/1337
2018/0107126 A1* 4/2018 Zhang ................ G03F 7/70683

FOREIGN PATENT DOCUMENTS

| CN | 107329295 A | 11/2017 |
| CN | 209388070 U | 9/2019 |

* cited by examiner

SUBSTRATE AND METHOD FOR MONITORING POSITIONS OF BOUNDARIES OF FILM LAYER ON THE SUBSTRATE

This application claims filed Nov. 19, 2019 Chinese Patent Application No. 201911131299.3, entitled "Substrate and method for monitoring positions of boundaries of film layer on the substrate" in Chinese Priority Patent Application, the entire content of which is incorporated by reference in the present application.

FIELD OF INVENTION

The present application relates to the field of productions of liquid crystal displays, and in particular, to a substrate and a method for monitoring positions of boundaries of a film layer disposed on a substrate.

BACKGROUND OF INVENTION

Generally, alignment films of TFT LCDs are polyimide films (that is, PI alignment films), which allow liquid crystals to be neatly arranged in liquid crystal cells through physical or chemical action to form ordered pretilt angles so that the LCDs can display normally. A uniformity of a thickness of the PI alignment films is directly related to an alignment ability of the PI alignment films. Uniformity controls of the PI alignment films at edges of display regions have always been problems in TFT LCD processes. An accuracy of the PI alignment films is one of key factors affecting the uniformity of the thickness of the PI alignment films at the edges of the display regions. Generally, offline manual measurements are adopted, which waste a lot of debugging time and reduce production efficiencies. Optimizing an accuracy monitoring of PI alignment films can effectively improve an accuracy of monitoring, thereby increasing productivity and reducing labor costs.

Therefore, current technologies have defects and urgently need improvements.

Technical Problem

The present invention provides a substrate and a method for monitoring positions of boundaries of a film layer disposed on a substrate, which can solve problems of low monitoring accuracy caused by manual measurements, and consume a lot of debugging time, and low production efficiency.

Technical Solution

In order to solve the above problems, the technical solution provided by the present invention is as follows:

The present invention provides a method for monitoring positions of boundaries of a film layer disposed on a substrate, the method comprising following steps of:

a step S10, providing the substrate, wherein the substrate is provided with a plurality of sets of positioning units corresponding to a non-display region around a display region, each set of the positioning units comprises at least two primary positioning marks and at least two primary positioning rulers, which are arranged in line-sharp at equal intervals from an edge of the display region to an edge of the substrate, and the primary positioning marks are disposed corresponding to the primary positioning rules;

a step S20, collecting position data of the plurality of sets of positioning units corresponding to the boundaries of the film layer from an inside to an outside respectively by starting from the edge of the display region; and a step S30, determining the primary positioning marks of the plurality of sets of positioning units corresponding to the boundaries of the film layer according to the position data and obtaining readings of the primary positioning rulers corresponding to the primary positioning marks to determine specific positions of the boundaries of the film layer.

In the method of the present invention, the readings of the primary positioning rulers are sequentially increased from the edge of the display region to the edge of the substrate, and the readings of the primary positioning rulers are a number of a count corresponding to the primary positioning marks from the edge of the display region to the edge of the substrate.

In the method of the present invention, at least two secondary positioning marks and at least two secondary positioning rulers corresponding to the at least two secondary positioning marks are arranged in line-sharp at equal intervals between the two adjacent primary positioning marks, a reading of the secondary positioning ruler between the two adjacent primary positioning marks is sequentially increased from the edge of the display region to a side of the edge of the substrate, and the reading of the secondary positioning ruler is a number of a count of the secondary positioning mark from a direction in which a reading of the primary positioning ruler increased between the two adjacent primary positioning marks.

In the method of the present invention, a distance between the two adjacent primary positioning marks is equal to a product of a number of the secondary positioning marks between the two adjacent primary positioning marks and a secondary unit interval between the two adjacent secondary positioning marks.

In the method of the present invention, the step of obtaining the readings of the primary positioning rulers corresponding to the primary positioning marks to determine the specific positions of the boundaries of the film layer comprises:

if the boundary of the film layer corresponding to the positioning unit is directly facing the primary positioning mark, then a distance between the boundary of the film layer and the edge of the display region is a product of the reading of the corresponding primary positioning ruler and a primary unit interval between the two adjacent primary positioning marks; and if the boundary of the film layer corresponding to the positioning unit is disposed between the two adjacent primary positioning marks, then obtaining the reading of the primary positioning ruler with the boundary of the film layer close to a side of the display region adjacent to the boundary of the film layer, then determining the secondary positioning mark corresponding to the boundary of the film layer, and obtaining the reading of the secondary positioning ruler corresponding to the secondary positioning mark to determine the specific position of the boundary of the film layer.

In the method of the present invention, the step of obtaining the reading of the secondary positioning ruler corresponding to the secondary positioning mark to determine the specific position of the boundary of the film layer comprises:

if the boundary of the film layer corresponding to the positioning unit is directly facing the secondary positioning mark, obtaining the reading of the corresponding secondary positioning rule, wherein the distance between the boundary of the film layer and the edge of the display region is equal to a product of the reading of the secondary positioning rule and the secondary unit interval between the two adjacent secondary positioning marks plus a product of the obtained reading of the primary positioning ruler and the primary unit interval; and if the boundary of the film layer corresponding to the positioning unit is disposed between the two adjacent secondary positioning marks, then obtaining the reading of the secondary positioning ruler where the boundary of the film layer is close to the side of the display region and adjacent to the boundary of the film layer, wherein the distance between the boundary of the film layer and the edge of the display region is equal to the product of the obtained reading of the primary positioning ruler and the primary unit interval plus the product of the obtained reading of the secondary positioning ruler and the secondary unit interval plus one-half of the secondary unit interval.

In order to solve the above technical problems, the present invention further provides a substrate comprising a base and a film layer disposed on the base, wherein the substrate is provided with a plurality of sets of positioning units corresponding to a non-display region around a display region, each set of the positioning units comprises at least two primary positioning marks and at least two primary positioning rulers, which are arranged in line-sharp at equal intervals from an edge of the display region to an edge of the substrate, and the primary positioning marks are disposed corresponding to the primary positioning rules;

wherein at least two secondary positioning marks and at least two secondary positioning rulers corresponding to the at least two secondary positioning marks are arranged in line-sharp at equal intervals between the two adjacent primary positioning marks; and wherein a primary unit interval is disposed between the two adjacent primary positioning marks, a secondary unit interval is disposed between the two adjacent secondary positioning marks, and a specific position of the boundary of the film layer is determined according to readings of the primary positioning ruler and the secondary positioning ruler of the plurality of sets of positioning units corresponding to the boundary of the film layer and a combination of the primary unit interval and the secondary unit interval.

In the substrate of the present invention, the reading of the secondary positioning ruler between the two adjacent primary positioning marks is sequentially increased from the edge of the display region to a side of the edge of the substrate, and the reading of the secondary positioning ruler is a number of a count in a direction in which a corresponding reading of the secondary positioning mark increased from the reading of the primary positioning ruler between the two adjacent primary positioning marks.

In the substrate of the present invention, the specific position of the boundary of the film layer is a distance between the boundary of the film layer and the edge of the display region, and the distance between the boundary of the film layer and the edge of the display region is equal to a product of the reading of the primary positioning ruler of the plurality of sets of positioning units corresponding to the boundary of the film layer and the primary unit interval plus a product of the reading of the secondary positioning ruler corresponding to the boundary of the film layer and the secondary unit interval.

In order to solve the above technical problems, the present invention further provides a substrate comprising a base and a film layer disposed on the base, wherein the substrate is provided with a plurality of sets of positioning units corresponding to a non-display region around a display region, each set of the positioning units comprises at least two primary positioning marks and at least two primary positioning rulers, which are arranged in line-sharp at equal intervals from an edge of the display region to an edge of the substrate, and the primary positioning marks are disposed corresponding to the primary positioning rules;

wherein at least two secondary positioning marks and at least two secondary positioning rulers corresponding to the at least two secondary positioning marks are arranged in line-sharp at equal intervals between the two adjacent primary positioning marks;

wherein a primary unit interval is disposed between the two adjacent primary positioning marks, a secondary unit interval is disposed between the two adjacent secondary positioning marks, and a distance between the two adjacent primary positioning marks is equal to a product of a number of the secondary positioning marks between the two adjacent primary positioning marks and a secondary unit interval between the two adjacent secondary positioning marks; and wherein a specific position of the boundary of the film layer is determined according to readings of the primary positioning ruler and the secondary positioning ruler of the plurality of sets of positioning units corresponding to the boundary of the film layer and a combination of the primary unit interval and the secondary unit interval.

In the substrate of the present invention, the reading of the primary positioning ruler is sequentially increased from the edge of the display region to the edge of the substrate, and the reading of the primary positioning ruler is a number of a count corresponding to the primary positioning mark from the edge of the display region to the edge of the substrate.

In the substrate of the present invention, the reading of the secondary positioning ruler between the two adjacent primary positioning marks is sequentially increased from the edge of the display region to a side of the edge of the substrate, and the reading of the secondary positioning ruler is a number of a count in a direction in which a corresponding reading of the secondary positioning mark increased from the reading of the primary positioning ruler between the two adjacent primary positioning marks.

In the substrate of the present invention, the specific position of the boundary of the film layer is a distance between the boundary of the film layer and the edge of the display region, and the distance between the boundary and the film layer to the edge of the display region is equal to a product of the reading of the primary positioning ruler of the plurality of sets of positioning units corresponding to the boundary of the film layer and the primary unit interval plus a product of the reading of the secondary positioning ruler corresponding to the boundary of the film layer and the secondary unit interval.

Beneficial Effect

The beneficial effects of the claimed invention are: Compared with current method for monitoring positions of boundaries of a film layer disposed on a substrate, the present invention provides a plurality of sets of positioning units at positions corresponding to a non-display region around a substrate. Each set of positioning units is composed of a primary positioning mark and a corresponding primary positioning rule, and a secondary positioning mark and a secondary positioning rule nested under the primary positioning mark. With this design, an accuracy of confirming positions of boundaries of a film layer can be greatly improved, thereby shortening start-up time, increasing production capacity and reducing labor costs.

DESCRIPTION OF DRAWINGS

The following detailed description of specific embodiments of the present invention will make the technical solution and other beneficial effects of the present invention obvious in conjunction with the accompanying drawings.

DETAILED DESCRIPTION OF PREFERRED EMBODIMENTS

Figure 1:
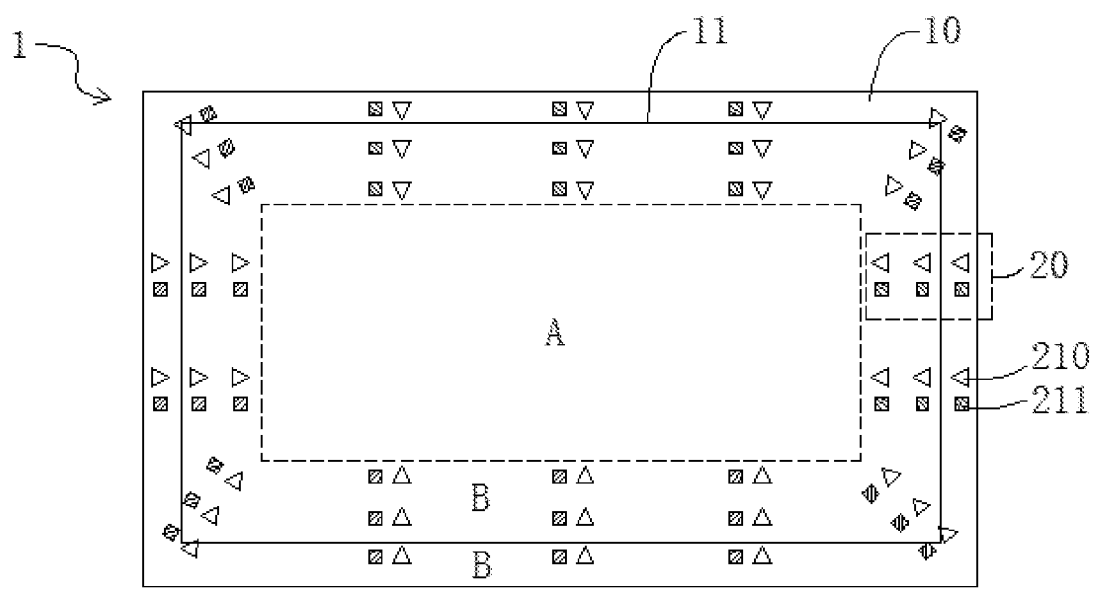
FIG. 1 is a schematic structural view of a substrate provided by an embodiment of the present invention.

The technical solution in the embodiments of the present invention will be clearly and completely described below with reference to the accompanying drawings in the embodiments of the present invention. It is to be understood that the described embodiments are merely exemplary of the invention, and not restrictive of the full scope of the invention. All other embodiments, which can be obtained by a person skilled in the art without inventive step based on the embodiments of the present invention, are within the scope of the present invention.

In the description of the present invention, it is to be understood that the terms "center," "longitudinal," "lateral," "length," "width," "thickness," "upper," "lower," "front," "rear," "left," "right," "vertical," "horizontal," "top," "bottom," "inner," "outer," "clockwise," "counterclockwise," and the like are used in the orientations and positional relationships indicated in the drawings for convenience in describing the present invention and for simplicity in description, and are not intended to indicate or imply that the referenced devices or elements must have a particular orientation, be constructed in a particular orientation, and be operated in a particular manner, and are not to be construed as limiting the present invention. Furthermore, the terms "first" and "second" are used for descriptive purposes only and are not to be construed as indicating or implying relative importance or implicitly indicating the number of technical features indicated. Thus, features defined as "first", "second", may explicitly or implicitly include one or more of the described features. In the description of the present application, "I" represents or means, "*", "=", "+", "−", etc. represent mathematical operation symbols. The meaning of "plurality" is two or more, unless specifically defined otherwise.

The present invention is directed to current method for monitoring positions of boundaries of a film layer disposed on a substrate, which has technical problems of low monitoring accuracy, a large amount of debugging time, and low productivity. The embodiment can solve the defects.

As shown in FIG. 1, which is a schematic structural view of a substrate provided by an embodiment of the present invention. The substrate 1 comprises a substrate 10 and a film layer 11 disposed on the substrate 10. The substrate 1 is provided with a plurality of sets of positioning units 20 corresponding to a non-display region B around a display region A. Each set of the positioning units 20 comprises at least two primary positioning marks 210 and at least two primary positioning rulers 211, which are arranged in line-sharp at equal intervals from an edge of the display region A to an edge of the substrate 1, and the primary positioning marks 210 are disposed corresponding to the primary positioning rules 211. As shown in the figure, the plurality of sets of the positioning units 20 may be disposed in a direction perpendicular to peripheral edges of the display region A, and the peripheral edges of the film layer 11 may be accurately positioned. It can also be disposed along a diagonal direction of the display region A, and boundaries of four corners of the film layer 11 can be accurately positioned.

The substrate 1 may be an array substrate, a color filter substrate, a flexible substrate, or the like. In the embodiment, a form of the substrate is not limited. For substrates that need to measure/locate positions of boundaries of a film layer, the structure of the substrate in the embodiment of the present invention can be adopted. In the embodiment, a PI layer is selected as the film layer 11, but is not limited thereto. Any other film layer on the substrate 1 that needs to determine the positions of the boundaries can be used.

Because in the design of alignment films, in order not to affect pretilt angles of liquid crystal molecules, the alignment films must completely cover the display region A, and the boundaries of the alignment films exceed a size of the display region A need to be within a set range, therefore, in the embodiment, the boundary (edge) of the display region A is a starting point of a reading of the primary positioning rulers 211 (the reading of the starting point is 0). There is a primary unit interval between the two adjacent primary positioning marks 210. A distance between the primary positioning mark 210 and the boundary of the display region A is the distance of one primary unit interval.

In the embodiment of the present invention, the number of the primary positioning marks 210 included in each set of positioning unit 20 is not limited. Multiple sets can be made according to actual process requirements, but each of the primary positioning marks 210 only corresponds to one of the primary positioning rulers 211. Readings of the primary positioning rulers 211 are sequentially increased from the edge of the display region A to the edge of the substrate 1, and the readings of the primary positioning rulers 211 are a number of a count corresponding to the primary positioning marks 210 from the edge of the display region A to the edge of the substrate 1.

The primary positioning mark 210 and the primary positioning ruler 211 can be made on any film layer before the film layer 11 is formed through a photomask. For the convenience of confirmation, it is recommended to use opaque materials or thick color film color resist layers, spacers, black matrix, etc. It is not recommended to use ITO, PV, and other thin and transparent film layers.

Further, the primary positioning mark 210 can be set into a variety of shapes that are easy to process and identify, and can be square, rectangular, circular, diamond, and triangular. In the embodiment, a specific shape of the primary positioning mark 210 is not limited. A triangular positioning mark is taken as an example to describe the solution of the embodiment in detail.

Figure 2:
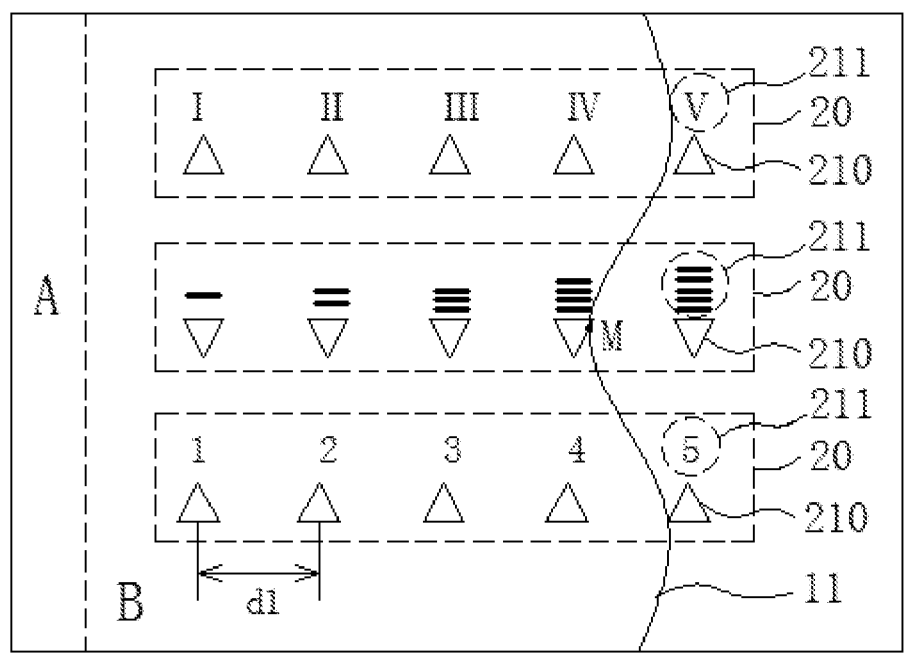
FIG. 2 is a schematic structural view of three different positioning units according to the embodiment of the present invention.

As shown in FIG. 2, which are three different positioning units provided in the embodiments of the present invention. The primary positioning marks 210 are disposed at equal intervals along a direction perpendicular to the boundary of the display region A. The distance between the two adjacent primary positioning marks 210 in the same positioning unit 20 is the distance of one primary unit interval d1. The primary unit interval d1 is designed according to requirements, such as 200 μm/300 μm/500 μm/600 μm, etc., and is not limited here. The reading of the primary positioning ruler 211 is a counting symbol for easy identification, including but not limited to the three counting symbols in the figure. Usually for the convenience of implementation, the same manufacturer recommends uniformly using a positioning mark and a counting symbol.

Figure 3:
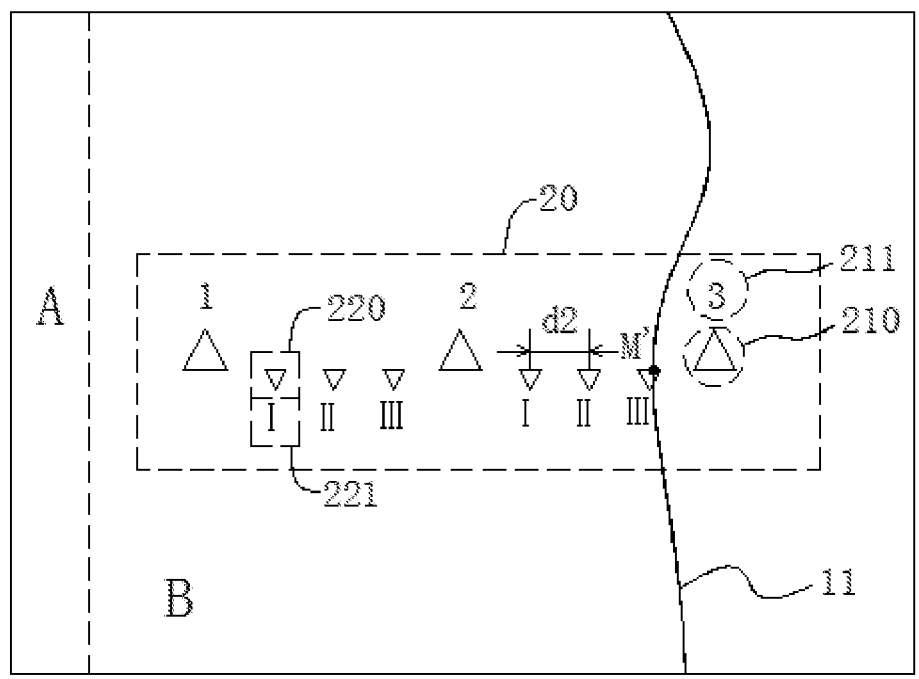
FIG. 3 is a schematic structural view of another substrate provided by an embodiment of the present invention.

In order to make the monitoring accuracy more accurate, the embodiment of the present invention further provides a schematic structural view of another substrate. As shown in FIG. 3, the positioning mark and positioning ruler with nested design can be used based on FIG. 1. Specifically, at least two secondary positioning marks 220 and at least two secondary positioning rulers 221 corresponding to the at least two secondary positioning marks 220 are arranged in line-sharp at equal intervals between the two adjacent primary positioning marks 210. A reading of the secondary positioning ruler 221 between the two adjacent primary positioning marks 210 is sequentially increased from the edge of the display region A to a side of the edge of the substrate 1, and the reading of the secondary positioning ruler 221 is a number of a count of the secondary positioning mark 220 from a direction in which a reading of the primary positioning ruler 211 increased between the two adjacent primary positioning marks 210.

In order to make the monitoring accuracy more accurate, at least two of the secondary positioning remarks 220 and the corresponding secondary positioning ruler 221 can also be set in the same manner between the boundary of the display region A and the first set of the primary positioning marks 210 of the positioning units 20.

In another embodiment, the secondary positioning mark 220 and the secondary positioning ruler 221 corresponding to the secondary positioning mark 220 may be disposed between two adjacent primary positioning marks 210 according to actual needs.

In the embodiment of the present invention, the number of the secondary positioning marks 220 included in each set of the positioning unit 20 is not limited, and a plurality of positioning marks 220 can be made according to actual process requirements.

A secondary unit interval d2 is between the secondary positioning mark 210 adjacent to the secondary positioning mark 210 and the two adjacent secondary positioning marks 220. A distance (i.e. the primary unit interval d1) between the two adjacent primary positioning marks 210 is equal to a product of a number of the secondary positioning marks 220 between the two adjacent primary positioning marks 210 and the secondary unit interval d2 between the two adjacent secondary positioning marks 220. In the embodiment, the primary unit interval d1 is 600 μm, and the secondary unit interval d2 is 150 μm, but it is not limited thereto.

For the method for making the secondary positioning mark 220 and the secondary positioning ruler 221, the used materials, and the shape of the mark, please refer to the description of the primary positioning mark 210 and the primary positioning ruler 211 above, which will not repeat here.

To facilitate better discrimination, an area of the secondary positioning mark 220 is smaller than an area of the primary positioning mark 210. A reading counting symbol of the secondary positioning ruler 221 and a reading counting symbol of the primary positioning ruler 211 may be set differently, or may be set differently in positional relationship. As shown in FIG. 3. But it is not limited thereto, as long as it can be clearly distinguished.

A specific position of the boundary of the film layer 11 is determined according to the readings of the primary positioning ruler 211 and the secondary positioning ruler 221 of the plurality of sets of positioning units 20 corresponding to the boundary of the film layer 11, and a combination of the primary unit interval and the secondary unit interval. For specific methods, please refer to the description in the following method of monitoring the positions of the boundaries of the film layer disposed on the substrate, which will not be repeated here.

Using the above substrate with the positioning unit 20 for determining the positions of the boundaries of the film layer can significantly shorten the commissioning time, save labor and reduce production costs.

Figure 4:
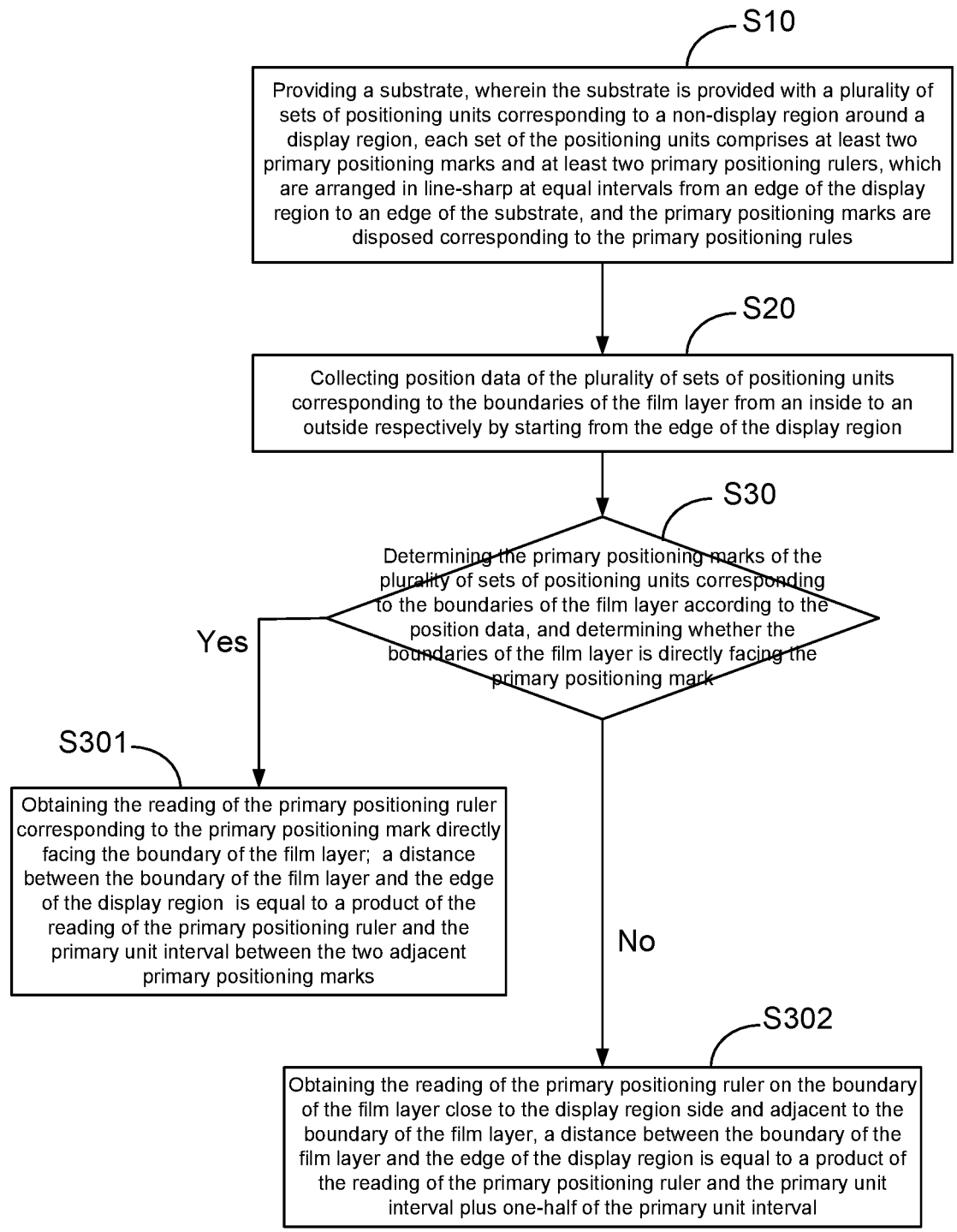
FIG. 4 is a flowchart of a method for monitoring positions of boundaries of a film layer disposed on the substrate in FIG. 1 provided by the present invention.

With reference to FIG. 1, FIG. 2, and FIG. 4, the present invention further provides a method for monitoring positions of boundaries of a film layer 11 on a first substrate 1. The method comprises following steps of:

a step S10, providing a substrate 1, wherein the substrate 1 is provided with a plurality of sets of positioning units 20 corresponding to a non-display region B around a display region A, each set of the positioning units 20 comprises at least two primary positioning marks 210 and at least two primary positioning rulers 211, which are arranged in line-sharp at equal intervals from an edge of the display region A to an edge of the substrate 1, and the primary positioning marks 210 are disposed corresponding to the primary positioning rules 211;

a step S20, collecting position data of the plurality of sets of positioning units 20 corresponding to the boundaries of the film layer 11 from an inside to an outside respectively by starting from the edge of the display region A; and a step S30, determining the primary positioning marks 210 of the plurality of sets of positioning units 20 corresponding to the boundaries of the film layer 11 according to the position data, determining whether the boundaries of the film layer 11 is directly facing the primary positioning mark 210, and obtaining readings of the primary positioning rulers 211 corresponding to the primary positioning marks 210 to determine specific positions of the boundaries of the film layer 11.

Specifically, obtaining the readings of the primary positioning rulers 211 corresponding to the primary positioning marks 210 to determine the specific positions of the boundaries of the film layer 11 in the step 30 comprises following steps:

a step S301, if the boundary of the film layer 11 is directly facing the primary positioning mark 210, then obtaining the reading of the primary positioning ruler 211 corresponding to the primary positioning mark 210 directly facing the boundary of the film layer 11. A distance between the boundary of the film layer 11 and the edge of the display region A is equal to a product of the reading of the primary positioning ruler 211 and the primary unit interval d1 between the two adjacent primary positioning marks 210, thereby the specific position of the boundary of the film layer 11 is determined.

As shown in a point M in FIG. 2, wherein the point M is a point on the boundary of the film layer 11. The above method is used to determine that the point M is directly facing the primary positioning mark 210 of the positioning unit 20, and the reading of the corresponding primary positioning ruler 211 is 4. Taking the primary unit interval d1 as 600 μm as an example, the distance between the boundary of the film layer 11 corresponding to the set of positioning unit 20 and the edge of the display region A can be calculated as 600 μm*4=2400 μm.

A step S302, if the boundary of the film layer 11 is disposed between the two adjacent primary positioning marks 210, then obtaining the reading of the primary positioning ruler 211 on the boundary of the film layer 11 close to the display region A side and adjacent to the boundary of the film layer 11. A distance between the boundary of the film layer 11 and the edge of the display region A is equal to a product of the reading of the primary positioning ruler 211 and the primary unit interval d1 plus one-half of the primary unit interval d1, thereby the specific position of the boundary of the film layer 11 is determined.

Figure 5:
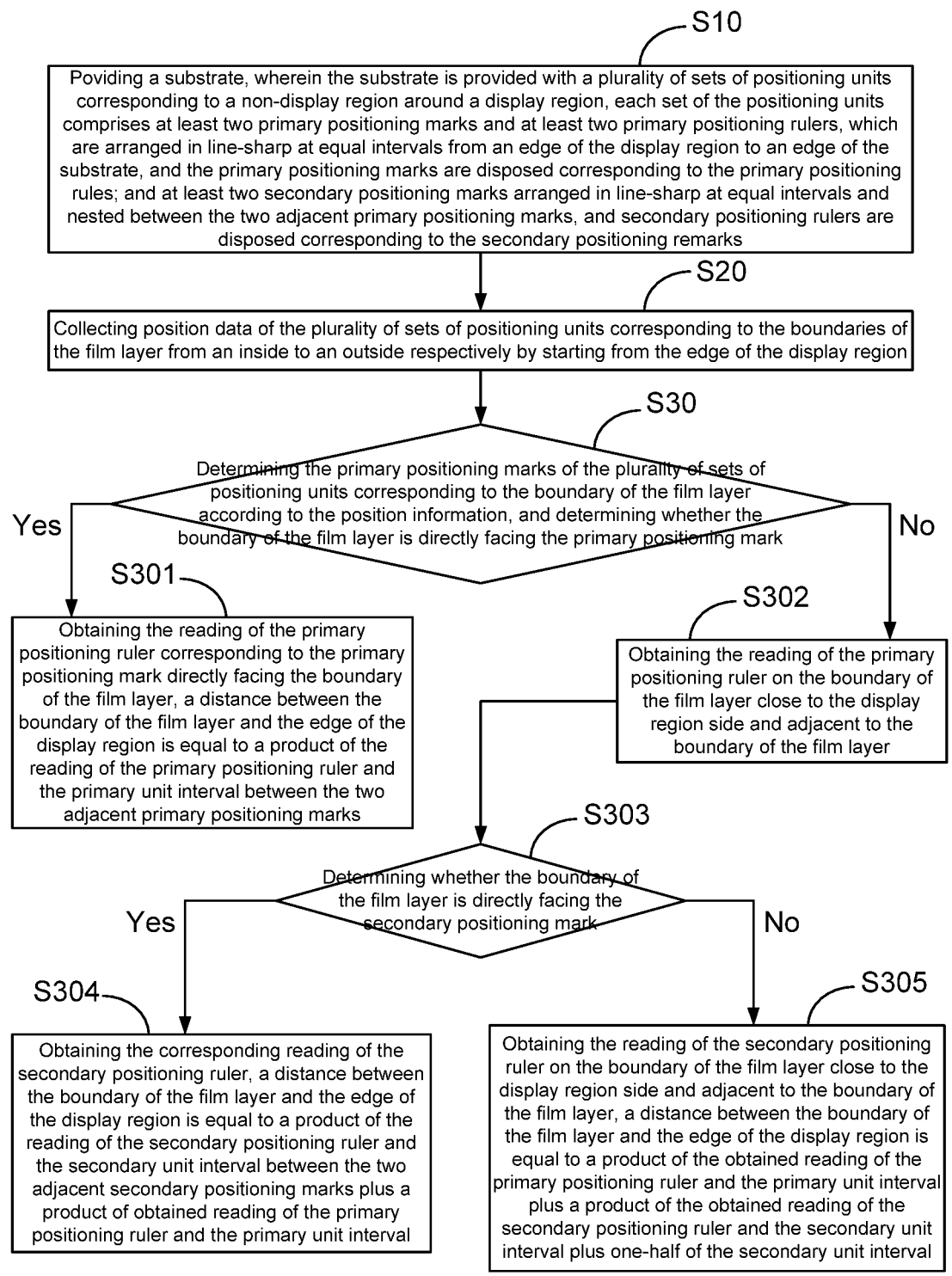
FIG. 5 is a flowchart of the method for monitoring the positions of the boundaries of the film layer disposed on the substrate in FIG. 3 provided by the present invention.

With reference to FIG. 3 and FIG. 5, the present invention further provides a method for monitoring positions of boundaries of a film layer 11 on the second substrate 1. The method comprises following steps of:

a step S10, providing a substrate 1, wherein the substrate 1 is provided with a plurality of sets of positioning units 20 corresponding to a non-display region B around a display region A, each set of the positioning units 20 comprises at least two primary positioning marks 210 and at least two primary positioning rulers 211, which are arranged in line-sharp at equal intervals from an edge of the display region A to an edge of the substrate 1, and the primary positioning marks 210 are disposed corresponding to the primary positioning rules 211; and at least two secondary positioning marks 220 arranged in line-sharp at equal intervals and nested between the two adjacent primary positioning marks 210, and secondary positioning rulers 221 are disposed corresponding to the secondary positioning remarks 220.

a step S20, collecting position data of the plurality of sets of positioning units 20 corresponding to the boundaries of the film layer 11 from an inside to an outside respectively by starting from the edge of the display region A; and a step S30, determining the primary positioning marks 210 of the plurality of sets of positioning units 20 corresponding to the boundary of the film layer 11 according to the position information, and determining whether the boundary of the film layer 11 is directly facing the primary positioning mark 210.

Specifically, the step S30 further comprises the following steps:

a step S301, if the boundary of the film layer 11 is directly facing the primary positioning mark 210, obtaining the reading of the primary positioning ruler 211 corresponding to the primary positioning mark 210 directly facing the boundary of the film layer 11. A distance between the boundary of the film layer 11 and the edge of the display region A is equal to a product of the reading of the primary positioning ruler 211 and the primary unit interval d1 between the two adjacent primary positioning marks 210;

a step S302, if the boundary of the film layer 11 corresponding to the positioning unit 20 is disposed between the two adjacent primary positioning marks 210, then obtaining the reading of the primary positioning ruler 211 on the boundary of the film layer 11 close to the display region A side and adjacent to the boundary of the film layer 11; and a step S303: determining the secondary positioning mark 220 corresponding to the boundary of the film layer 11, determining whether the boundary of the film layer 11 is directly facing the secondary positioning mark 220, and obtaining the reading of the secondary positioning ruler 221 corresponding to the secondary positioning mark 220 to determine the specific position of the boundary of the film layer 11.

Specifically, a method of obtaining the reading of the secondary positioning ruler 221 corresponding to the secondary positioning mark 220 to determine the specific position of the boundary of the film layer 11 comprise the following steps:

a step S304, if the boundary of the film layer 11 corresponding to the positioning unit 20 is directly facing the secondary positioning mark 220, then obtaining the corresponding reading of the secondary positioning ruler 221. A distance between the boundary of the film layer 11 and the edge of the display region A is equal to a product of the reading of the secondary positioning ruler 221 and the secondary unit interval d2 between the two adjacent secondary positioning marks 220 plus a product of obtained reading of the primary positioning ruler 211 and the primary unit interval d1.

As shown in a point M' in FIG. 3, wherein the point M' is a point on the boundary of the film layer 11 corresponding to the positioning unit 20. The point M' is directly facing the secondary positioning mark 220. A distance between the boundary of the film layer 11 and the edge of the display region A at the positioning unit 20 is equal to 2 (the reading of the primary positioning ruler 211)*600 μm (the primary unit interval d1) plus 3 (the reading of the secondary positioning ruler 221)*150 μm (the secondary unit interval d2) is equal to 1650 μm.

a step S305, if the boundary of the film layer 11 corresponding to the positioning unit 20 is disposed between the two adjacent secondary positioning marks 220, then obtaining the reading of the secondary positioning ruler 221 on the boundary of the film layer 11 close to the display region A side and adjacent to the boundary of the film layer 11. A distance between the boundary of the film layer 11 and the edge of the display region A is equal to a product of the obtained reading of the primary positioning ruler 211 and the primary unit interval d1 plus a product of the obtained reading of the secondary positioning ruler 221 and the secondary unit interval d2 plus one-half of the secondary unit interval d2, thereby the specific position of the boundary of the film layer 11 can be determined.

In summary, the present invention provides the plurality of sets of positioning units at the positions corresponding to the non-display region around the substrate. Each set of positioning units is composed of the primary positioning mark and the corresponding primary positioning rule, and the secondary positioning mark and the secondary positioning rule nested under the primary positioning mark. With this design, the accuracy of confirming the positions of the boundaries of the film layer can be greatly improved, thereby shortening start-up time, increasing production capacity and reducing labor costs.

In the above, various other corresponding changes and modifications can be made according to the technical solutions and technical ideas of the present invention to those skilled in the art, and all such changes and modifications are within the scope of the claims of the present invention.

What is claimed is:

1. A method for monitoring positions of boundaries of a film layer disposed on a substrate, the method comprising following steps of:

a step S10, providing the substrate, wherein the substrate is provided with a plurality of sets of positioning units corresponding to a non-display region around a display region, each set of the positioning units comprises at least two primary positioning marks and at least two primary positioning rulers, wherein each of the primary positioning marks is arranged in line-shape at equal intervals from an edge of the display region to an edge of the substrate, each of the primary positioning rulers is arranged in line-sharp shape at equal intervals from the edge of the display region to the edge of the substrate, and the primary positioning marks are disposed corresponding to the primary positioning rulers;

a step S20, collecting position data of the plurality of sets of positioning units corresponding to the boundaries of the film layer from an inside to an outside respectively by starting from the edge of the display region; and a step S30, determining the primary positioning marks of the plurality of sets of positioning units corresponding to the boundaries of the film layer according to the position data and obtaining readings of the primary positioning rulers corresponding to the primary positioning marks to determine specific positions of the boundaries of the film layer;

wherein at least two secondary positioning marks and at least two secondary positioning rulers corresponding to the at least two secondary positioning marks are arranged in line-shape at equal intervals between two adjacent primary positioning marks, a reading of the secondary positioning ruler between two adjacent primary positioning marks is sequentially increased from the edge of the display region to a side of the edge of the substrate, and the reading of the secondary positioning ruler is a number of a count of the secondary positioning mark from a direction in which a reading of the primary positioning ruler increased between two adjacent primary positioning marks;

wherein an area of the secondary positioning mark is smaller than an area of the primary positioning mark, and a reading counting symbol of the secondary positioning ruler and a reading counting symbol of the primary positioning ruler are different.

2. The method as claimed in claim 1, wherein the readings of the primary positioning rulers are sequentially increased from the edge of the display region to the edge of the substrate, and the readings of the primary positioning rulers are a number of a count corresponding to the primary positioning marks from the edge of the display region to the edge of the substrate.

3. The method as claimed in claim 1, wherein a distance between two adjacent primary positioning marks is equal to a product of a number of the secondary positioning marks between two adjacent primary positioning marks and a secondary unit interval between two adjacent secondary positioning marks.

4. The method as claimed in claim 1, wherein the step of obtaining the readings of the primary positioning rulers corresponding to the primary positioning marks to determine the specific positions of the boundaries of the film layer comprises:

if the boundary of the film layer corresponding to the positioning unit is directly facing the primary positioning mark, then a distance between the boundary of the film layer and the edge of the display region is a product of the reading of the corresponding primary positioning ruler and a primary unit interval between two adjacent primary positioning marks; and if the boundary of the film layer corresponding to the positioning unit is disposed between two adjacent primary positioning marks, then obtaining the reading of the primary positioning ruler with the boundary of the film layer close to a side of the display region adjacent to the boundary of the film layer, then determining the secondary positioning mark corresponding to the boundary of the film layer, and obtaining the reading of the secondary positioning ruler corresponding to the secondary positioning mark to determine the specific position of the boundary of the film layer.

5. The method as claimed in claim 4, wherein the step of obtaining the reading of the secondary positioning ruler corresponding to the secondary positioning mark to determine the specific position of the boundary of the film layer comprises:

if the boundary of the film layer corresponding to the positioning unit is directly facing the secondary positioning mark, obtaining the reading of the corresponding secondary positioning rule, wherein the distance between the boundary of the film layer and the edge of the display region is equal to a product of the reading of the secondary positioning ruler and the secondary unit interval between two adjacent secondary positioning marks plus a product of the obtained reading of the primary positioning ruler and the primary unit interval; and if the boundary of the film layer corresponding to the positioning unit is disposed between two adjacent secondary positioning marks, then obtaining the reading of the secondary positioning ruler where the boundary of the film layer is close to the side of the display region and adjacent to the boundary of the film layer, wherein the distance between the boundary of the film layer and the edge of the display region is equal to the product of the obtained reading of the primary positioning ruler and the primary unit interval plus the product of the obtained reading of the secondary positioning ruler and the secondary unit interval plus one-half of the secondary unit interval.

6. A substrate, comprising a base and a film layer disposed on the base, wherein the substrate is provided with a plurality of sets of positioning units corresponding to a non-display region around a display region, each set of the positioning units comprises at least two primary positioning marks and at least two primary positioning rulers, wherein each of the primary positioning marks is arranged in line-shape at equal intervals from an edge of the display region to an edge of the substrate, each of the primary positioning rulers is arranged in line-sharp shape at equal intervals from the edge of the display region to the edge of the substrate, and the primary positioning marks are disposed corresponding to the primary positioning rulers;

wherein at least two secondary positioning marks and at least two secondary positioning rulers corresponding to the at least two secondary positioning marks are arranged in line-shape at equal intervals between two adjacent primary positioning marks; and wherein a primary unit interval is disposed between two adjacent primary positioning marks, a secondary unit interval is disposed between two adjacent secondary positioning marks, and a specific position of the boundary of the film layer is determined according to readings of the primary positioning ruler and the secondary positioning ruler of the plurality of sets of positioning units corresponding to the boundary of the film layer and a combination of the primary unit interval and the secondary unit interval;

wherein an area of the secondary positioning mark is smaller than an area of the primary positioning mark, and a reading counting symbol of the secondary positioning ruler and a reading counting symbol of the primary positioning ruler are different.

7. The substrate as claimed in claim 6, wherein the reading of the primary positioning ruler is sequentially increased from the edge of the display region to the edge of the substrate, and the reading of the primary positioning ruler is a number of a count corresponding to the primary positioning mark from the edge of the display region to the edge of the substrate.

8. The substrate as claimed in claim 7, wherein the reading of the secondary positioning ruler between two adjacent primary positioning marks is sequentially increased from the edge of the display region to a side of the edge of the substrate, and the reading of the secondary positioning ruler is a number of a count in a direction in which a corresponding reading of the secondary positioning mark increased from the reading of the primary positioning ruler between two adjacent primary positioning marks.

9. The substrate as claimed in claim 6, wherein the specific position of the boundary of the film layer is a distance between the boundary of the film layer and the edge of the display region, and the distance between the boundary of the film layer and the edge of the display region is equal to a product of the reading of the primary positioning ruler of the plurality of sets of positioning units corresponding to the boundary of the film layer and the primary unit interval plus a product of the reading of the secondary positioning ruler corresponding to the boundary of the film layer and the secondary unit interval.

10. A substrate, comprising:
a base and a film layer disposed on the base, wherein the substrate is provided with a plurality of sets of positioning units corresponding to a non-display region around a display region, each set of the positioning units comprises at least two primary positioning marks and at least two primary positioning rulers, wherein each of the primary positioning marks is arranged in line-shape at equal intervals from an edge of the display region to an edge of the substrate, each of the primary positioning rulers is arranged in line-sharp shape at equal intervals from the edge of the display region to the edge of the substrate, and the primary positioning marks are disposed corresponding to the primary positioning rulers;
wherein at least two secondary positioning marks and at least two secondary positioning rulers corresponding to the at least two secondary positioning marks are arranged in line-shape at equal intervals between two adjacent primary positioning marks;
wherein a primary unit interval is disposed between two adjacent primary positioning marks, a secondary unit interval is disposed between two adjacent secondary positioning marks, and a distance between two adjacent primary positioning marks is equal to a product of a number of the secondary positioning marks between two adjacent primary positioning marks and a secondary unit interval between two adjacent secondary positioning marks; and
wherein a specific position of the boundary of the film layer is determined according to readings of the primary positioning ruler and the secondary positioning ruler of the plurality of sets of positioning units corresponding to the boundary of the film layer and a combination of the primary unit interval and the secondary unit interval;
wherein an area of the secondary positioning mark is smaller than an area of the primary positioning mark, and a reading counting symbol of the secondary positioning ruler and a reading counting symbol of the primary positioning ruler are different.

11. The substrate as claimed in claim 10, wherein the reading of the primary positioning ruler is sequentially increased from the edge of the display region to the edge of the substrate, and the reading of the primary positioning ruler is a number of a count corresponding to the primary positioning mark from the edge of the display region to the edge of the substrate.

12. The substrate as claimed in claim 11, wherein the reading of the secondary positioning ruler between two adjacent primary positioning marks is sequentially increased from the edge of the display region to a side of the edge of the substrate, and the reading of the secondary positioning ruler is a number of a count in a direction in which a corresponding reading of the secondary positioning mark increased from the reading of the primary positioning ruler between two adjacent primary positioning marks.

13. The substrate as claimed in claim 10, wherein the specific position of the boundary of the film layer is a distance between the boundary of the film layer and the edge of the display region, and the distance between the boundary and the film layer to the edge of the display region is equal to a product of the reading of the primary positioning ruler of the plurality of sets of positioning units corresponding to the boundary of the film layer and the primary unit interval plus a product of the reading of the secondary positioning ruler corresponding to the boundary of the film layer and the secondary unit interval.

* * * * *